(12) United States Patent
Harrison et al.

(10) Patent No.: US 9,824,972 B2
(45) Date of Patent: Nov. 21, 2017

(54) CONTACTS FOR SEMICONDUCTOR DEVICES AND METHODS OF FORMING THEREOF

(71) Applicant: Infineon Technologies AG, Neubiberg (DE)

(72) Inventors: Mark James Harrison, Wernberg (AT); Martin Sporn, Melk (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/383,731

(22) Filed: Dec. 19, 2016

(65) Prior Publication Data

US 2017/0098614 A1    Apr. 6, 2017

Related U.S. Application Data

(62) Division of application No. 14/324,890, filed on Jul. 7, 2014, now Pat. No. 9,553,016.

(51) Int. Cl.
| H01L 23/48 | (2006.01) |
| H01L 23/52 | (2006.01) |
| H01L 29/40 | (2006.01) |
| H01L 23/532 | (2006.01) |
| H01L 23/522 | (2006.01) |
| H01L 21/768 | (2006.01) |
| H01L 21/3065 | (2006.01) |
| H01L 21/285 | (2006.01) |

(52) U.S. Cl.
CPC .... *H01L 23/53266* (2013.01); *H01L 21/2855* (2013.01); *H01L 21/28518* (2013.01); *H01L 21/3065* (2013.01); *H01L 21/76841* (2013.01); *H01L 23/5226* (2013.01)

(58) Field of Classification Search
CPC ......... H01L 23/53266; H01L 21/28518; H01L 21/2855; H01L 21/3065; H01L 21/76841; H01L 23/5226
USPC ........................................................ 257/753
See application file for complete search history.

(56) References Cited

U.S. PATENT DOCUMENTS

| 4,404,235 A | 9/1983 | Tarng et al. |
| 5,252,181 A | 10/1993 | Dutartre et al. |
| 5,587,039 A | 12/1996 | Salimian et al. |
| 5,833,758 A | 11/1998 | Linn et al. |
| 5,980,265 A | 11/1999 | Tischler |
| 6,124,218 A | 9/2000 | Hwang |
| 6,365,516 B1 | 4/2002 | Frenkel et al. |
| 6,776,874 B2 | 8/2004 | Kobayashi et al. |
| 8,487,440 B2 | 7/2013 | Harrison et al. |
| 9,553,016 B2 * | 1/2017 | Harrison ............. H01L 23/4827 |
| 2003/0236003 A1 | 12/2003 | Koo et al. |
| 2004/0137750 A1 | 7/2004 | Nemoto et al. |
| 2005/0136576 A1 | 6/2005 | Ishihara et al. |
| 2005/0189616 A1 | 9/2005 | Brennan et al. |
| 2007/0111519 A1 | 5/2007 | Lubomirsky et al. |

(Continued)

*Primary Examiner* — Thien F Tran
(74) *Attorney, Agent, or Firm* — Slater Matsil, LLP

(57) ABSTRACT

A method for a method of forming a semiconductor device includes providing a semiconductor substrate having a bottom surface opposite a top surface with circuitry disposed at the top surface. The method further includes forming a first metal layer having a first metal over the bottom surface of the semiconductor substrate. The first metal layer is formed by depositing an adhesion promoter followed by depositing the first metal.

21 Claims, 13 Drawing Sheets

(56) References Cited

U.S. PATENT DOCUMENTS

| | | |
|---|---|---|
| 2008/0230911 A1 | 9/2008 | Li |
| 2008/0237779 A1 | 10/2008 | Yamazaki et al. |
| 2008/0286382 A1 | 11/2008 | Lyons |
| 2008/0296627 A1 | 12/2008 | Watanabe et al. |
| 2009/0286382 A1 | 11/2009 | Huff |
| 2010/0167485 A1 | 7/2010 | Wang et al. |
| 2012/0214303 A1 | 8/2012 | Ganguli et al. |
| 2012/0273481 A1 | 11/2012 | Wirtz et al. |
| 2014/0015141 A1 | 1/2014 | Harrison et al. |
| 2016/0005647 A1 | 1/2016 | Harrison et al. |

* cited by examiner

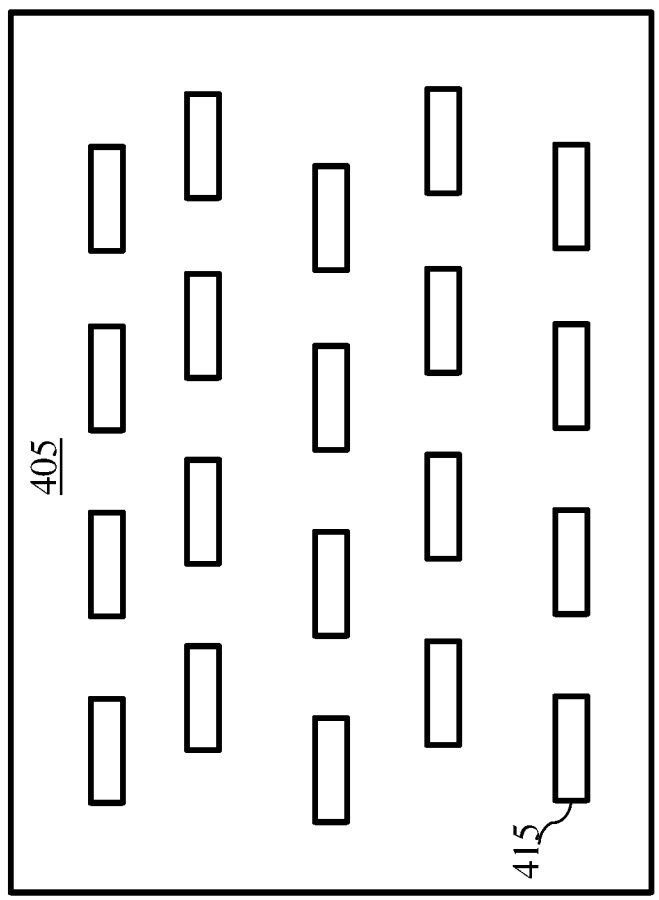

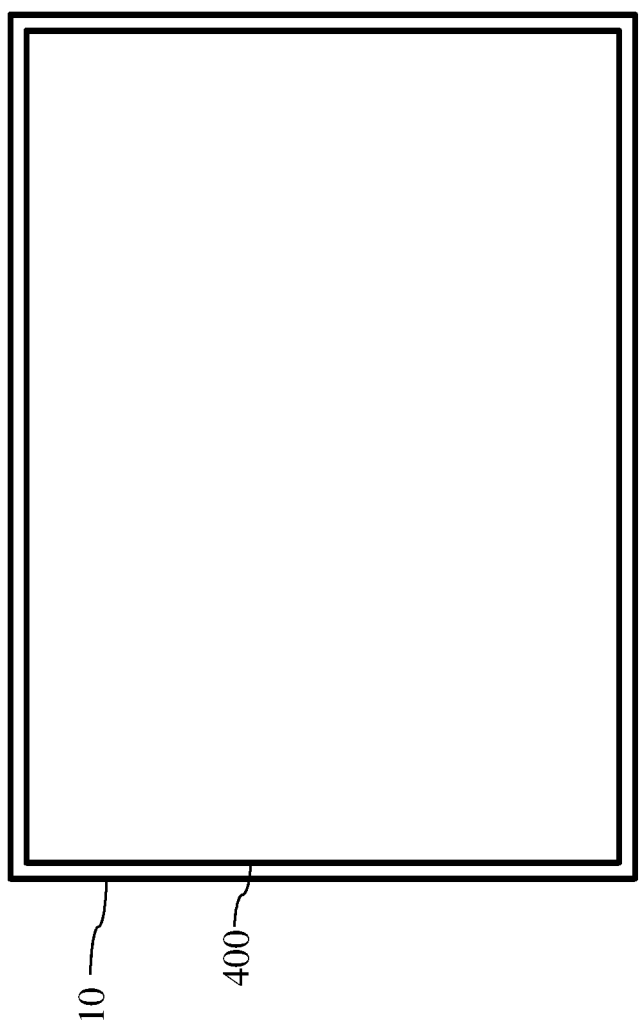

US 9,824,972 B2

CONTACTS FOR SEMICONDUCTOR DEVICES AND METHODS OF FORMING THEREOF

CROSS-REFERENCE TO RELATED APPLICATIONS

This application is a Divisional Application of U.S. patent Ser. No. 14/324,890 filed On Jul. 7, 2014, which is incorporated herein by reference.

This application relates to the following co-pending and commonly assigned patent applications: Ser. No. 13/932,851, filed Jul. 1, 2013; Ser. No. 12/833,755, filed Jul. 9, 2010, U.S. Pat. No. 8,487,440, which applications are hereby incorporated herein by reference.

TECHNICAL FIELD

The present invention relates generally to semiconductor devices, and, in particular embodiments, to contacts for semiconductor devices and methods thereof.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

Semiconductor devices are coupled to external circuits through front-side and backside contacts. Forming backside contacts with low resistance and good mechanical properties is one of the challenges with integrated circuits especially as package dimensions are scaled down.

SUMMARY OF THE INVENTION

In accordance with an embodiment of the present invention, a method of forming a semiconductor device comprises providing a semiconductor substrate having a bottom surface opposite a top surface with circuitry disposed at the top surface. The method further comprises forming a first metal layer comprising a first metal over the bottom surface of the semiconductor substrate. The first metal layer is formed by depositing a adhesion promoter followed by depositing the first metal.

In accordance with an alternative embodiment of the present invention, a method of forming a semiconductor device comprises cleaning a semiconductor substrate to expose a semiconductor material of the semiconductor substrate. The semiconductor material is exposed over a substantially entire major surface of the semiconductor substrate. Without breaking vacuum, an adhesion promoter is introduced followed by depositing a metal layer. The metal in the metal layer forms a silicide with the semiconductor material of the semiconductor substrate.

In accordance with an alternative embodiment of the present invention, a semiconductor device comprises metallization layers disposed over a top surface of a semiconductor substrate. The semiconductor substrate has a bottom surface opposite the top surface. An adhesion promoter is disposed at the bottom surface of the semiconductor substrate. A metal silicide layer is disposed over the bottom surface of the semiconductor substrate. The metal silicide layer is formed around the adhesion promoter. A first metal layer is disposed over the metal silicide layer and the adhesion promoter. The metal of the first metal layer is the same as a metal of the metal silicide layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1D illustrate a semiconductor device in accordance with an embodiment of the invention, wherein FIG. 1A illustrates a cross-sectional view and FIG. 1B illustrates a magnified cross-sectional view and FIG. 1C illustrates a magnified top view while FIG. 1D illustrates a top view;

DETAILED DESCRIPTION OF ILLUSTRATIVE EMBODIMENTS

Figure 1A:
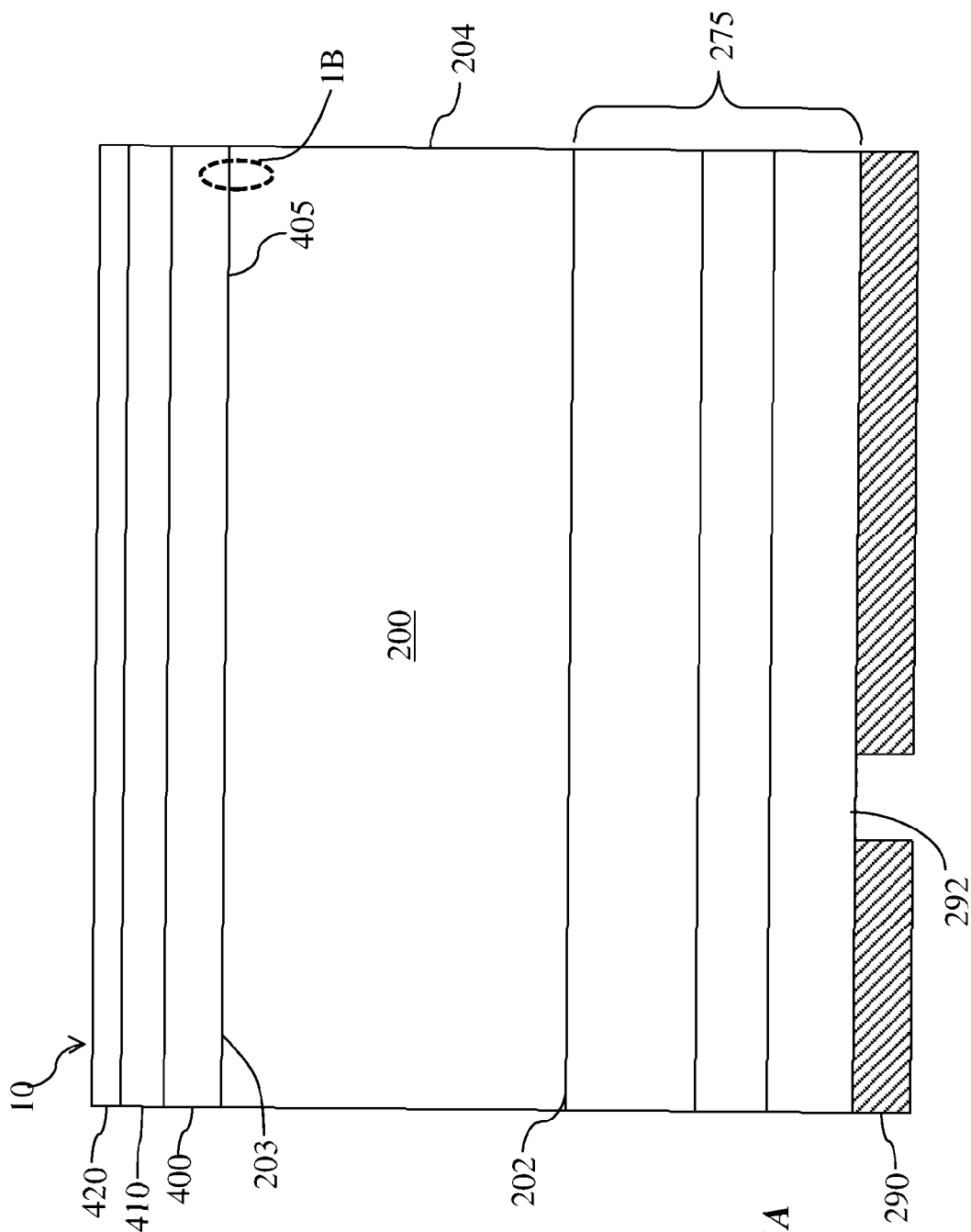

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely back side contacts for semiconductor devices. The invention may also be applied, however, to other types of devices and contacts.

Formation of mechanically stable contacts at the back surface of a wafer is important for forming contacts. Conventionally, an aluminum layer has been used at the interface between the silicon substrate and titanium for contact formation. However, aluminum corrodes easily and is susceptible to spiking (metal spikes) and hence cannot be used for small packages. Further, for contacting shallow junctions, the surface roughness of the aluminum may result in shorts across the junction. Further aluminum layers increase the contact resistance compared to other metal layers such as titanium.

Alternatively, to avoid these issues, a titanium layer is deposited after cleaning the wafer surface. However, when thick layers of titanium layer are deposited, the titanium layer may not have the required mechanical adhesion to the substrate and may result in defects due to delamination, peelings, and others.

Hydrogen plasma cleaning has been found to improve the formation of a titanium silicide layer especially when no subsequent high temperature anneal is performed. However, hydrogen plasma cleaning is not sufficient to produce titanium layers with good adhesion to the substrate if a subsequent high temperature anneal is required (e.g., for other reasons) after titanium deposition. In other words, if a high temperature anneal is subsequently done after titanium deposition then the titanium layer may sometimes easily delaminate even if hydrogen plasma pre-cleaning has been previously performed before titanium deposition. For example, the inventors have found that if a high temperature anneal (e.g., 375° C. or greater) is performed, then the adhesion strength (e.g., as measured using a tape test) deteriorates progressively with increase in thermal budget of the anneal. The inventors have observed five to ten atomic layers of poly-crystalline TiSi layer is formed between the titanium and the silicon using transmission electron microscopy. The inventors postulate that the high temperature anneal may degrade this poly-crystalline TiSi layer resulting in poor adhesion.

In various embodiments, the present invention overcomes these and other problems by the use of an adhesion promoter, which improves the mechanical adhesion of a thick metal layer such as titanium layer without degrading the contact resistance. In other words, the adhesion promoter is designed to not contribute to the electrical resistance of the contact. Advantageously, the improvements are achieved without any significant cost increase or degradation of the front side metallization or devices.

As will be described in various embodiments of the present invention, when an adhesion promoter (e.g., thin aluminum layer, carbon, silicon oxide) is used between the titanium and silicon, adhesion is greatly improved even if a high temperature anneal is subsequently performed. For example, when the dose of deposited adhesion promoter is very low, then the adhesion promoter may no longer be formed as a continuous layer but may form island like structures, which may result in it's not playing a role in the electrical behavior.

Structural embodiments of the invention will be first described using FIG. 1. A method of fabricating a semiconductor device will be described using FIGS. 2-5. A process tool implementing embodiments of the invention will be described using FIGS. 6 and 7. Additional structural embodiments will be described using FIGS. 8-10.

Figure 1B:
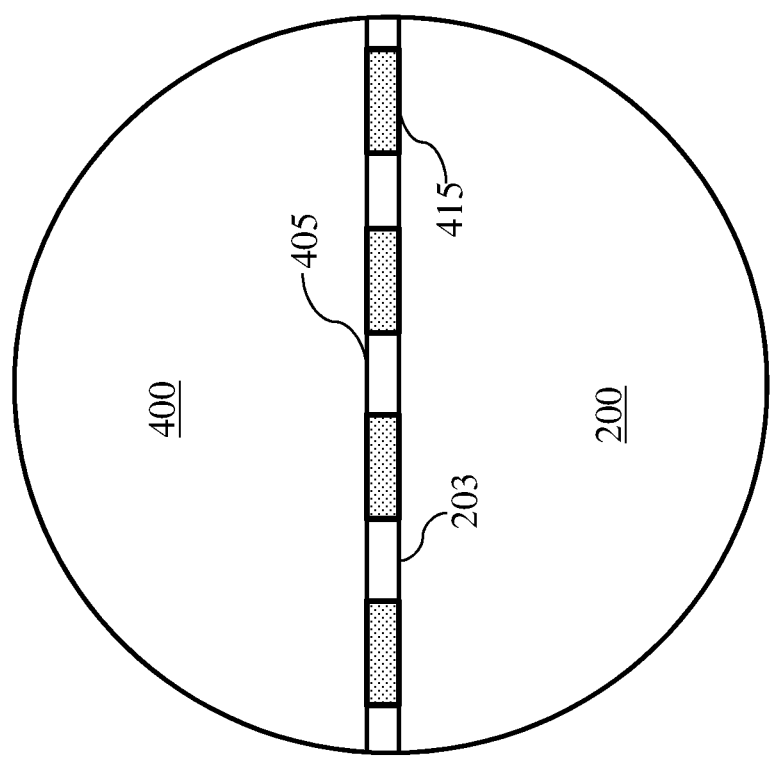

FIGS. 1A-1D illustrate a semiconductor device in accordance with an embodiment of the invention. FIG. 1A illustrates a cross-sectional view and FIG. 1B illustrates a magnified cross-sectional view and FIG. 1C illustrates a magnified top view while FIG. 1D illustrates a top view.

FIG. 1A illustrates a cross sectional view of a semiconductor device 10 having a substrate 200. The substrate 200 includes a top surface 202 and an opposite bottom surface 203. In various embodiments, the substrate 200 comprises silicon or other semiconductor materials including compound semiconductors such as Ge, InSb, GaAs, GaN, InP, SiGe, or SiC, as examples. The substrate 200 may also comprise a semiconductor on insulator substrate such as silicon-on-insulator (SOI) and hetero-epitaxial layers. The substrate 200 may include one or more epitaxial layers in various embodiments.

The substrate 200 includes device regions 204 adjacent the top surface 202. The device regions 204 may comprise active circuitry and may include transistors, resistors, capacitors, inductors, or other components used to form integrated circuits. The device regions 204 may include a plurality of devices (integrated circuit) or a discrete device in various embodiments. The devices in the device regions 204 may be separated by suitable means including isolation trenches and doping schemes such as well isolations, as examples.

In one or more embodiments, the device regions 204 comprise vertical transistors. For example, the substrate 200 may include one or more power transistors having a source contact and a gate contact at the top surface 202 and a drain contact at the bottom surface 203.

A plurality of metallization layers are disposed over the device regions 204 and form the back end of the line (BEOL) layer 275. The BEOL layer 275 may include many levels of metal lines and vias, which together interconnect the devices within the device 204 as well as provide electrical connections to external circuitry or adjacent circuits on the substrate 200. The number of metal levels within the BEOL layer 275 is selected based on the type of devices in the device regions of the semiconductor substrate 200. For example, the BEOL layer 275 over logic devices may include many layers, e.g., nine or more, of copper. In memory devices such as DRAMs, or analog devices, the number of metal levels may be less and may be aluminum. The BEOL layer 275 and device regions of the semiconductor substrate 200 together form a completed functional integrated circuit. In other words, the electrical functions of the chip can be performed by the interconnected active circuitry.

A passivation layer 290 may be formed over the BEOL layer 275 to protect and passivate the BEOL layer 275. The passivation layer 290 may include bond pads 292 to connect external circuitry to the BEOL layer 275. Alternatively, other types of contacts including under-bump metallization (UBM) and/or redistribution lines (RDL) may be formed to suitably connect the external circuitry to the BEOL layer 275.

Referring to FIG. 1A, the substrate 200 also includes back side metallization over the bottom surface 203. The back side metallization may be used to form a solder contact or a diffusion bond. The back side metallization may be used to create an electrical contact to the semiconductor substrate 200. The contact may be used to couple to a through substrate via (TSV) with a UBM or RDL for chip stacking, and/or to a heatsink.

The bottom surface 203 of the substrate 200 comprises a smooth surface in various embodiments. In various embodiments, the root mean square value of surface roughness of the bottom surface 203 is less than about 1 nm. A first metal layer 400 is disposed over the bottom surface 203. In various embodiments, the first metal layer 400 is about 10 nm to about 200 nm in thickness.

In various embodiments, the first metal layer 400 comprises titanium or tungsten. The first metal layer 400 is chosen to provide good ohmic contact in some embodiments.

FIG. 1B illustrates a magnified cross-sectional view as shown in the circle in FIG. 1A at the interface between the first metal layer 400 and the substrate 200. Referring to FIG. 1B, a metal silicide layer 405 is disposed over the bottom surface 203 of the substrate 200. In various embodiments, the metal silicide layer 405 is less than about five atomic layers in thickness. In various embodiments, the metal silicide layer 405 is less than about three atomic layers in thickness. In various embodiments, the metal silicide layer 405 is less than about 2 nm in thickness, and less than about 1 nm in one embodiment. The existence of the metal silicide layer 405 improves the ohmic contact in various embodiments.

Referring further to FIG. 1B, an adhesion promoter 415 is disposed on the bottom surface 203 of the substrate 200. The contact materials subsequently formed may have high intrinsic stress or may develop high stresses during product lifetime or further processing so that the contact may peel off from the substrate 200. In various embodiments, the adhesion promoter 415 improves mechanical properties by bonding strongly with the substrate 200. In one or more embodiments, the adhesion promoter 415 does not contribute to the contact resistance at the bottom surface 203.

In various embodiments, the adhesion promoter 415 is less than about five atomic layers in thickness. In various embodiments, the adhesion promoter 415 is less than about three atomic layers in thickness. In various embodiments, the adhesion promoter 415 is less than about 2 nm in thickness, and less than about 1 nm in one embodiment.

In various embodiments, the thickness of the adhesion promoter 415 is less than the thickness of the metal silicide layer 405. Further, the thickness of the adhesion promoter 415 and the thickness of the metal silicide layer 405 are both less than the thickness of the first metal layer 400.

Referring to FIG. 1A, in some embodiments, a second metal layer 410 may be disposed over the first metal layer 400. The second metal layer 410 provides a solder layer for contact formation. In some embodiments, the second metal layer 410 may be chosen as a seed layer for subsequent solder layers. In various embodiments, the second metal layer 410 is about 100 nm to about 500 nm in thickness. In one embodiment, the second metal layer 410 comprises nickel and/or vanadium, while in various embodiments, the second metal layer 410 may comprise any suitable metal.

A third metal layer 420 is disposed over the second metal layer 410. In various embodiments, the third metal layer 420 solders with the second metal layer 410 and also protects the underlying metals from the environment. Examples of the third metal layer 420 include Au, Ag, Au alloys, Ag alloys, and combinations thereof. In some embodiments, copper may be used as the third metal layer 420. In various embodiments, the third metal layer 420 comprises a thickness of about 100 to about 10000 nm.

FIG. 1C illustrates a magnified top view of the metal silicide layer, for example, in the cross-sectional view of FIG. 1B, formed around the adhesion promoter.

In various embodiments, the metal silicide layer 405 is formed over regions not covered by the adhesion promoter 415. However, the adhesion promoter 415 may provide texture to the surface thus improving the mechanical adhesion of the subsequent layers.

FIG. 1D illustrates a bottom view of the semiconductor device in accordance with an embodiment of the present invention. As illustrated in FIG. 1C, the back side metallization layer comprising the first metal layer 400 is applied across the complete or entire bottom side 203 of the semiconductor substrate 200. Further, the thickness of the first metal layer 400 is very thick, for example, at least 50% of the thickness of the thinned semiconductor substrate 200. Accordingly, the first metal layer 400 is susceptible to shearing, delamination, and other issues that are generally not observed for thin layers. Embodiments of the present invention overcome these issues, by advantageously, increasing the adhesion of the first metal layer 400 to the semiconductor substrate 200 by the use of the adhesion promoter 415 (FIG. 1B), which forms a non-continuous layer such as islands over the semiconductor substrate 200 thereby improving the adhesion of the first metal layer 400 with the semiconductor substrate 200.

FIGS. 2-5 illustrate a method of fabricating a semiconductor device in accordance with embodiments of the invention.

Figure 2:
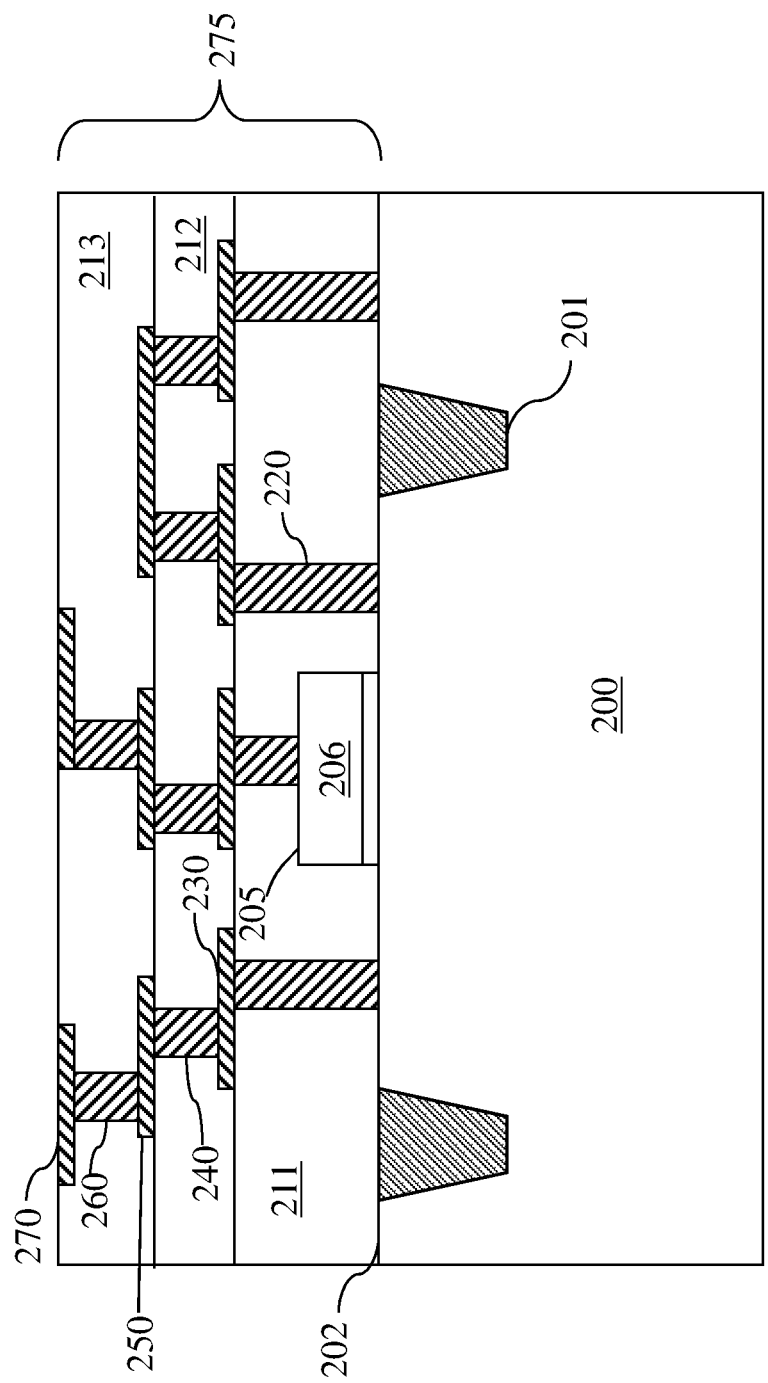
FIG. 2 illustrates a cross-sectional view of a semiconductor device after forming devices at the front side in accordance with an embodiment of the present invention.

FIG. 2 illustrates a cross-sectional view of a semiconductor device after forming devices at the front side in accordance with an embodiment of the present invention.

Referring to FIG. 2, device regions are formed on a top surface 202 of a substrate 200. As illustrated in FIG. 2, isolation regions 201 may be formed isolating various devices. Other types of isolation structures may be also be formed, for example, by implanting dopants into the substrate 200.

The device regions having at least a device 205 are formed within or over the substrate 200. The device regions may include isolation regions 201. The device 205 formed adjacent the top surface 202 may include many types of devices such as bipolar transistors, p-n diodes, transistors etc. The device 205 may be formed as a large discrete device wherein the substrate 200 comprises only a single device. Alternatively, in some embodiments, the device 205 may be formed as a passive device within the metallization layers (described below). Examples of such passive devices include resistor, capacitors such as metal/insulator/metal capacitors, and inductors.

In one or more embodiments, the device 205 may comprises micro-electro-mechanical system (MEMS) devices. In general, the device 205 can be any type of device including any active or passive semiconductor device as well other non-semiconducting devices.

The device 205 may contain features such as a gate electrode 206, which may control the operation of the device 205. In various embodiments, the gate electrode 206 may be part of a field effect transistor or a bipolar transistor such as an insulated gate bipolar transistor (IGBT). In various embodiments, the device 205 may be formed by doping regions of the substrate 200 with dopants to render certain regions n-type or p-type. In some embodiments, the device 205 may not include such features as the gate electrode 205.

Next, metallization is formed over the device regions to electrically contact and interconnect the device regions. The components formed during the front-end processing are interconnected by back end of line (BEOL) processing. During this process, contacts are made to the top surface 202 of the substrate 200 and are interconnected using metal lines and vias. As discussed above, modern integrated circuits incorporate many layers of vertically stacked metal lines and vias (multilevel metallization) that interconnect the various components in the chip.

In FIG. 2, only three levels of metal are illustrated, however, more or fewer metallization levels may be formed in other embodiments. First, second, and third metallization insulation layers 211, 212, and 213 are formed above a substrate 200. Each of the first, second, and third metallization insulation layers 211, 212, and 213 may comprise multiple layers. The first, second, and third metallization insulation layers 211, 212, and 213 may be separated by etch stop liners (not shown).

In one embodiment, the first metallization insulation layer 211 comprises an oxide such as tetra ethyl oxysilane (TEOS) or fluorinated TEOS (FTEOS), but various embodiments may comprise insulating materials typically used in semiconductor manufacturing for inter-level dielectric (ILD) layers. The first metallization insulation layer 211 may comprise a thickness of about 500 nm or less, for example, although alternatively, the first metallization insulation layer 211 may comprise other dimensions.

The second and third metallization insulation layers 212 and 213 comprise insulating materials typically used in semiconductor manufacturing for inter-level dielectric (ILD) layers, such as $SiO_2$, tetra ethyl oxysilane (TEOS), or a lower dielectric constant material such as fluorinated TEOS (FTEOS), doped glass (BPSG, PSG, BSG), organo silicate glass (OSG), fluorinated silicate glass (FSG), or spin-on glass (SOG). The second and third metallization insulation layers 212 and 213 may also comprise ultra-low k materials including porous dielectric materials.

First vias 220 or contact plugs are formed within the first metallization insulation layer 211. Similarly, first metal lines 230 are formed within the second metallization insulation layer 212. Similarly, second vias 240, second metal lines 250, third vias 260, and third metal lines 270 are formed until all metallization layers are completed. The metallization layers may be formed using either damascene or dual-damascene processes in various embodiments.

The vias and metal lines are formed from suitable metals. In some embodiments, the second and the third vias 240 and 260 comprise a copper core with an outer liner, e.g., of tantalum nitride and tantalum. In alternative, embodiments, the second and the third vias 240 and 260 may comprise tungsten core and outer liners of titanium and titanium nitride or other metal liners or liner combinations. In yet another embodiment, the second and the third vias 240 and 260 may comprise aluminum.

Figure 3:
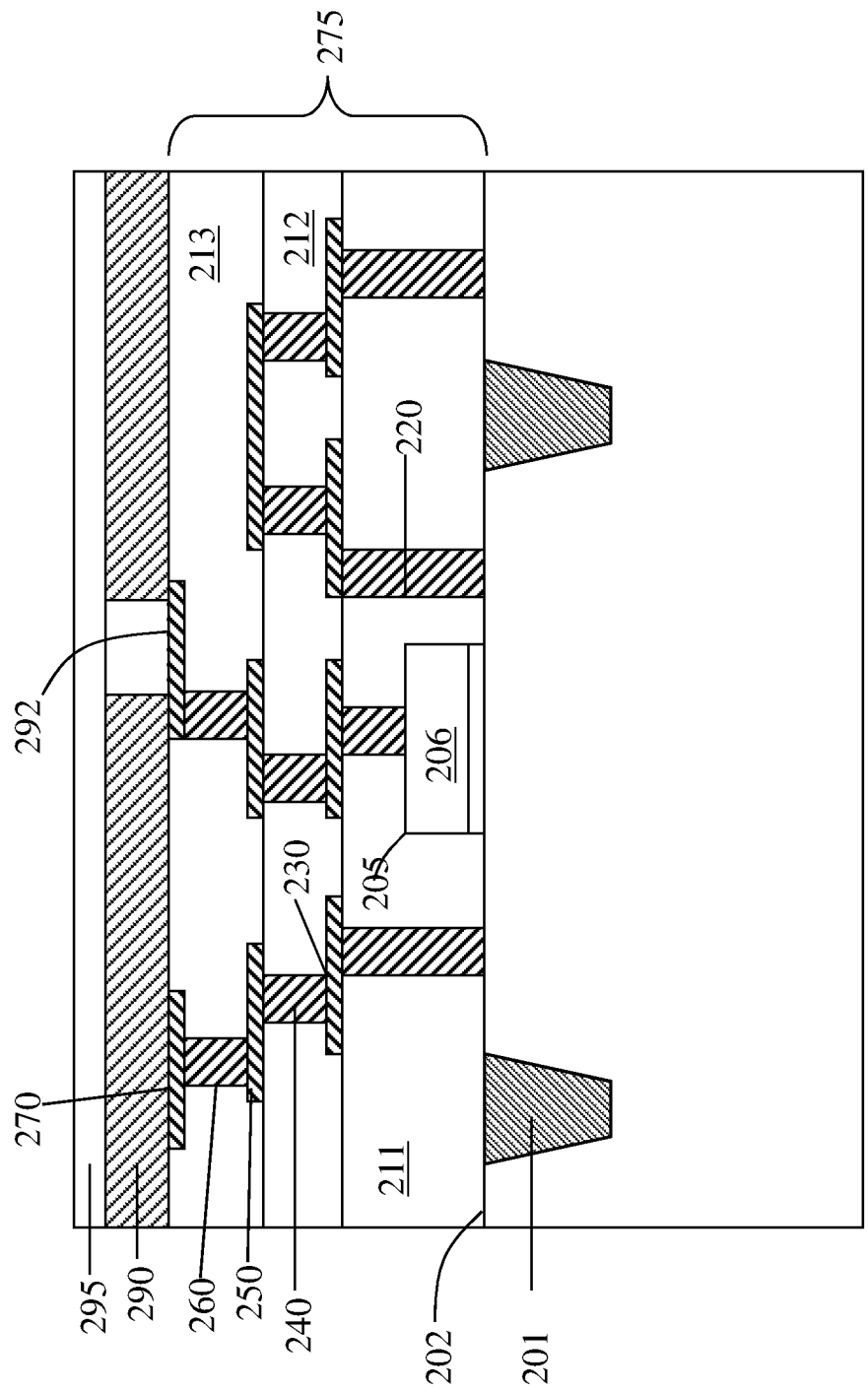
FIG. 3 illustrates a cross-sectional view of a semiconductor device after front side processing in accordance with an embodiment of the present invention.

FIG. 3 illustrates a cross-sectional view of a semiconductor device after front side processing in accordance with an embodiment of the present invention.

At this stage of processing, the back end processes are also completed, and hence all the metallization levels connecting the device 205 are fabricated. A passivation layer 290 is deposited over the last metal level (FIG. 3). External contact circuitry (not shown) may be formed within the passivation layer 290 to contact the bond pads 292 in the last metal level. The external contact circuitry may include UBMs and RDLs in various embodiments. A protective layer 295 may be deposited over the passivation layer 290 to protect the passivation layer 290 during subsequent processing. The protective layer 295 may comprise a hard mask layer or a resist material, in some embodiments. In one embodiment, the protective layer 295 comprises an imide layer.

Next, the backside of the substrate 200 is prepared for contact formation. The backside contact is formed as a large blanket contact in various embodiments. In one or more embodiments, the backside contact completely covers (or covers at least 80%) the backside of the substrate 200 (wafer). Forming good contacts especially with WTi (tungsten-titanium) and Ti (titanium) is difficult because of poor adhesion with the substrate 200.

In some embodiments, the substrate 200 may be thinned. In such embodiments, the substrate 200 may be thinned from the back side and passivated. For ease of handling during the thinning process, the protective layer 295 may be attached to a carrier tape. The substrate 200 is thinned exposing a lower surface by grinding to a desired thickness. The typical thickness of the substrate 200 after the thinning is about 20 µm to about 400 µm. In different embodiments, the thinning may also be performed chemically or by using a plasma etch. For example, a modified plasma etch may be used to thin the silicon wafer from the back side. Such techniques have the additional advantage of not damaging the front side.

Figure 6:
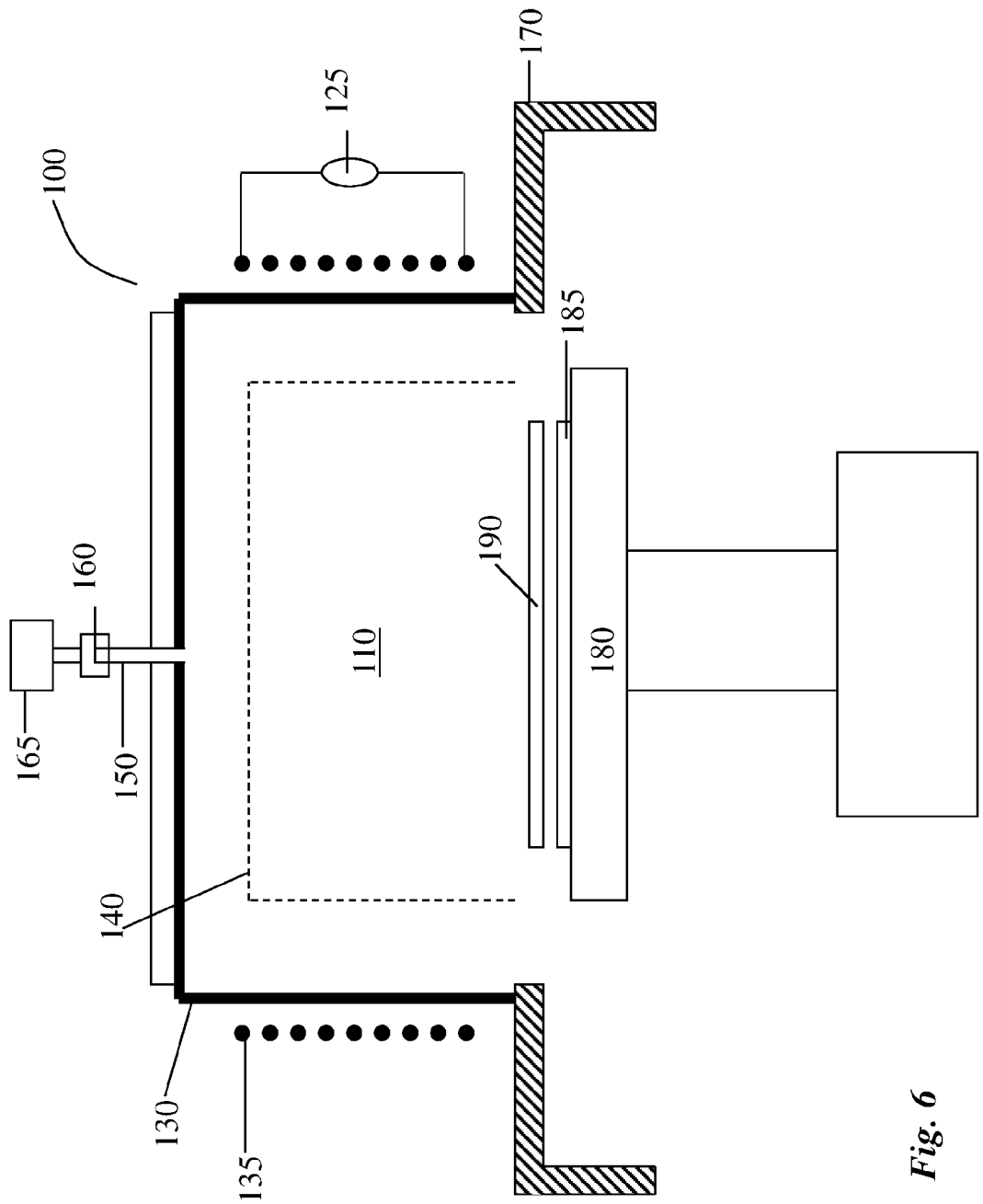
FIG. 6 illustrates a plasma etch tool used for cleaning the back surface prior to depositing the first metal layer at the back side of the substrate in accordance with embodiments of the invention.

The substrate 200 is placed inside a plasma etch tool and a plasma is generated for etching the native oxide from the bottom surface 203 of the substrate 200. The plasma etch tool is illustrated in FIG. 6 in accordance with embodiments of the invention. The plasma etch tool will be briefly described to clearly describe subsequent processing steps.

The plasma etch tool comprises a chuck 180, which, for example, may include a phenol coated chuck 185, on which a wafer 190 (including the substrate 200) may be placed. Alternatively, the wafer 190 may be placed on pins along the edges of the wafer. The chuck 180 is not grounded and electrically insulated in one or more embodiments.

The plasma etch tool comprises a plasma chamber 110 having, for example, quartz walls 130 over a support 170. The plasma chamber 110 includes inlets 150 and outlets (not shown) for gases for forming the plasma. In various embodiments, the plasma chamber 110 is surrounded by a metal cage 140 comprising e.g., aluminum.

The plasma etch tool comprises inductive coils 135 such as helical coils disposed around the quartz walls 130 and coupled to a power source 125. The power of the inductive coils 135 is about 200 W to about 1000 W, and about 850 W in one embodiment. The inductive coils 135 are coupled to a mid frequency power source 125, for example, between about 100 kHz to about 600 kHz, and about 400 kHz in one embodiment.

In various embodiments, the plasma in the plasma chamber 110 is ignited using microwave ignition cavity and ignition device 160. In one or more embodiments, plasma ignition is achieved by first introducing argon (Ar) into the plasma chamber 110 along with a small amount of hydrogen. The argon flow ratio may be about 1 sccm to about 100 sccm, and about 10 sccm in one embodiment.

In an alternative embodiment, after the wafer 190 is placed within the plasma chamber 110, only argon at a first flow rate is introduced. No hydrogen is introduced at this stage. After the plasma is ignited, hydrogen is introduced at a second flow rate. In one embodiment, after plasma ignition, the first flow rate is about 10 sccm and the second flow rate is about 20 sccm of hydrogen providing about 200% hydrogen to argon ratio. In various embodiments, the first and the second flow rates may be selected suitably as known to one skilled in the art.

Figure 4:
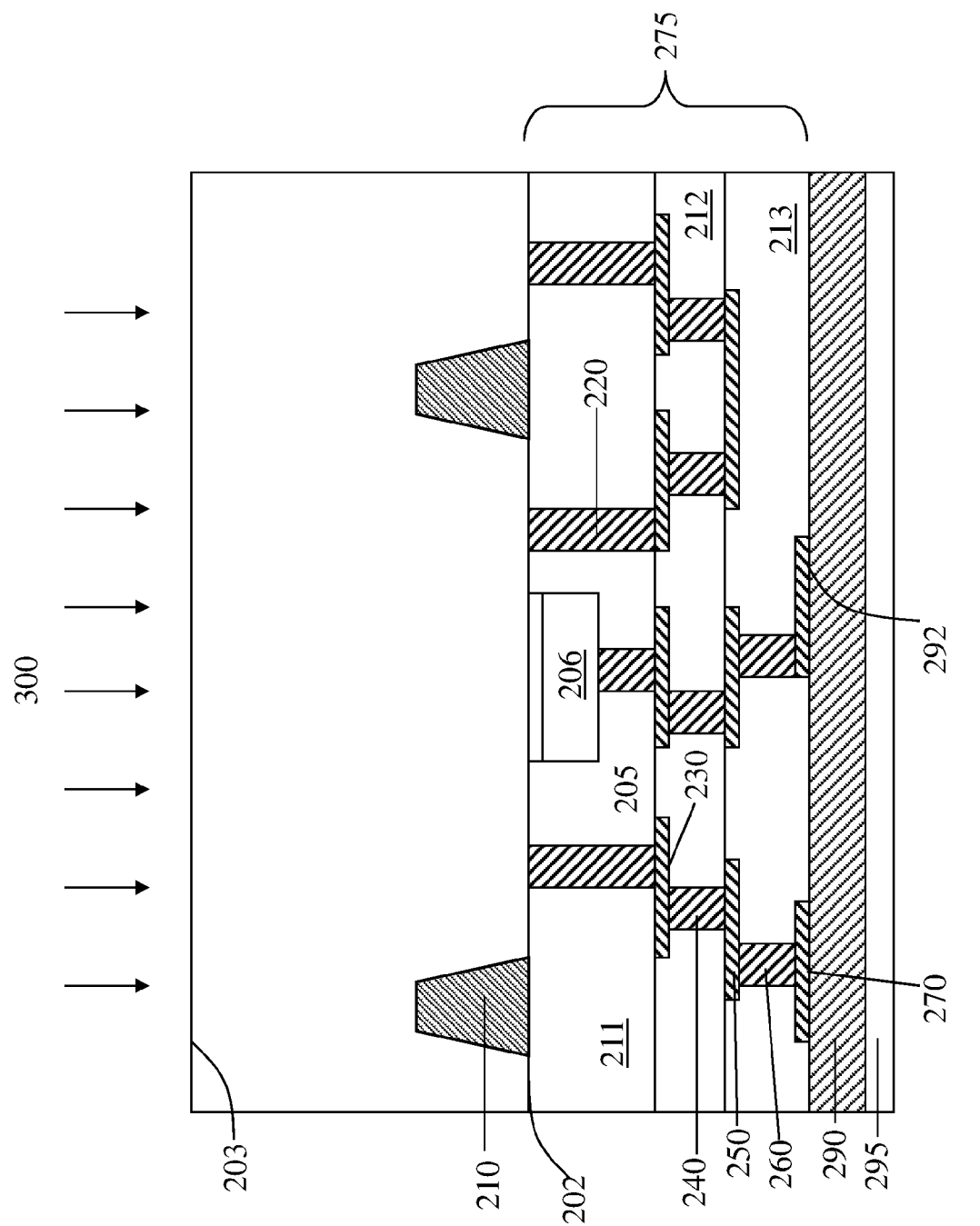
FIG. 4 illustrates a cross-sectional view of a semiconductor device after cleaning the back side of the substrate to remove native oxide and impurities in accordance with an embodiment of the present invention.

FIG. 4 illustrates a cross-sectional view of a semiconductor device after cleaning the back side of the substrate to remove native oxide in accordance with an embodiment of the present invention.

Referring to FIG. 4, a bottom surface 203 of the substrate 200 is exposed to the hydrogen plasma 300 thus created. During etching, the substrate 200 may acquire a self bias voltage. In various embodiments, no attempt is made to control this bias. The self bias is typically 30 V to about 40 V and is generated in response to the wafer 190 being placed in the plasma without grounding. The voltage produced varies slightly and is dependent on the product and plasma environment.

Advantageously, hydrogen plasma etching removes carbon contamination without implanting anything into the substrate 200. Further, the contaminants are removed as volatile gases such as $CH_4$, $SiH_2$, and $H_2O$, which do not result in any particle contamination. In contrast, argon sputtering is poor at removing carbon contamination and can actually implant argon and carbon into the surface. HF is also poor at removing carbon and leaves fluorine terminated dangling bonds.

The slow etch rates of the hydrogen plasma result in excellent surface uniformity and surface roughness compared to other types of etching processes. Therefore, in various embodiments, hydrogen plasma etching produces a uniform surface having excellent uniformity and good surface roughness. In one embodiment, the hydrogen plasma etch process maintains a smooth surface obtained after a prior process such as wet etching. In one or more embodiments, the root mean square value of surface roughness of the bottom surface is less than about 1 nm after the hydrogen plasma etching.

In various embodiments, the etch time within the plasma chamber may be timed, for example, to be about 10 s to about 100 s. In one embodiment, the etching is performed for about 25 s.

Figure 5:
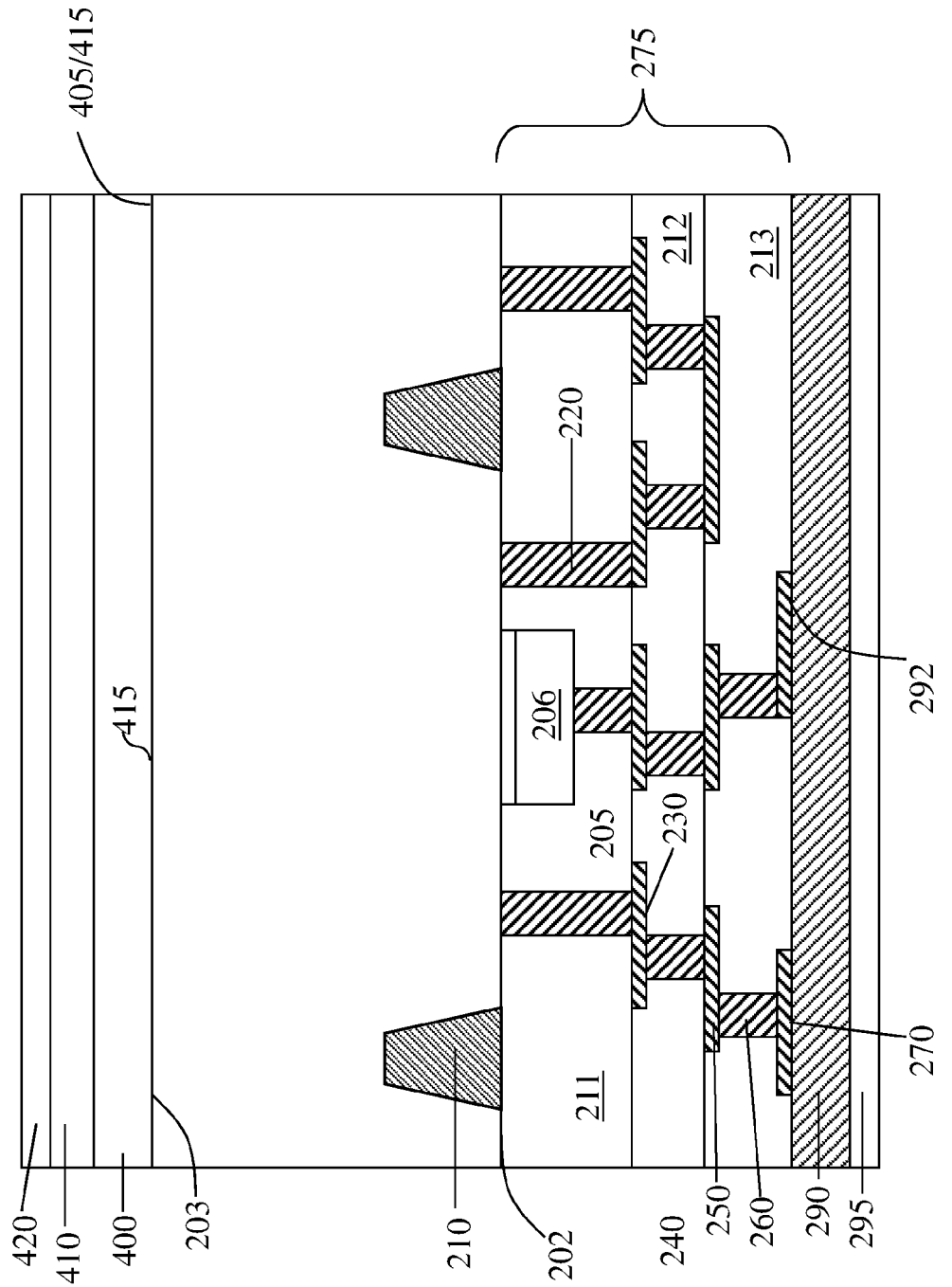
FIG. 5 illustrates a cross-sectional view of a semiconductor device after forming back side metallization layers for contacting to the substrate in accordance with an embodiment of the present invention.

FIG. 5 illustrates a cross-sectional view of a semiconductor device after forming the back side metallization layers in accordance with an embodiment of the present invention.

Referring next to FIG. 5, a first metal layer 400 is deposited over the bottom surface 203. In various embodiments, the thickness of the deposited first metal layer 400 is about 10 nm to about 200 nm. The first metal layer 400 may be deposited using a suitable deposition process including sputtering, physical layer deposition, chemical vapor deposition, evaporation, and/or electro-chemical deposition. In various embodiments, the first metal layer 400 is formed by depositing titanium or tungsten after introducing an adhesion promoter such as aluminum. In various embodiments, the first metal layer 400 is deposited without breaking vacuum after the hydrogen plasma. This may be accomplished, for example, in a clusterline tool having multiple chambers. This helps to avoid formation of a native oxide between the metal deposition and the hydrogen plasma etching, which removed the native oxide.

In various embodiments, the first metal layer 400 may be deposited using a magnetron sputtering tool. For example, a DC sputtering process may be used in which the adhesion promoter is first deposited or sputtered at low power and for a short time.

Figure 7:
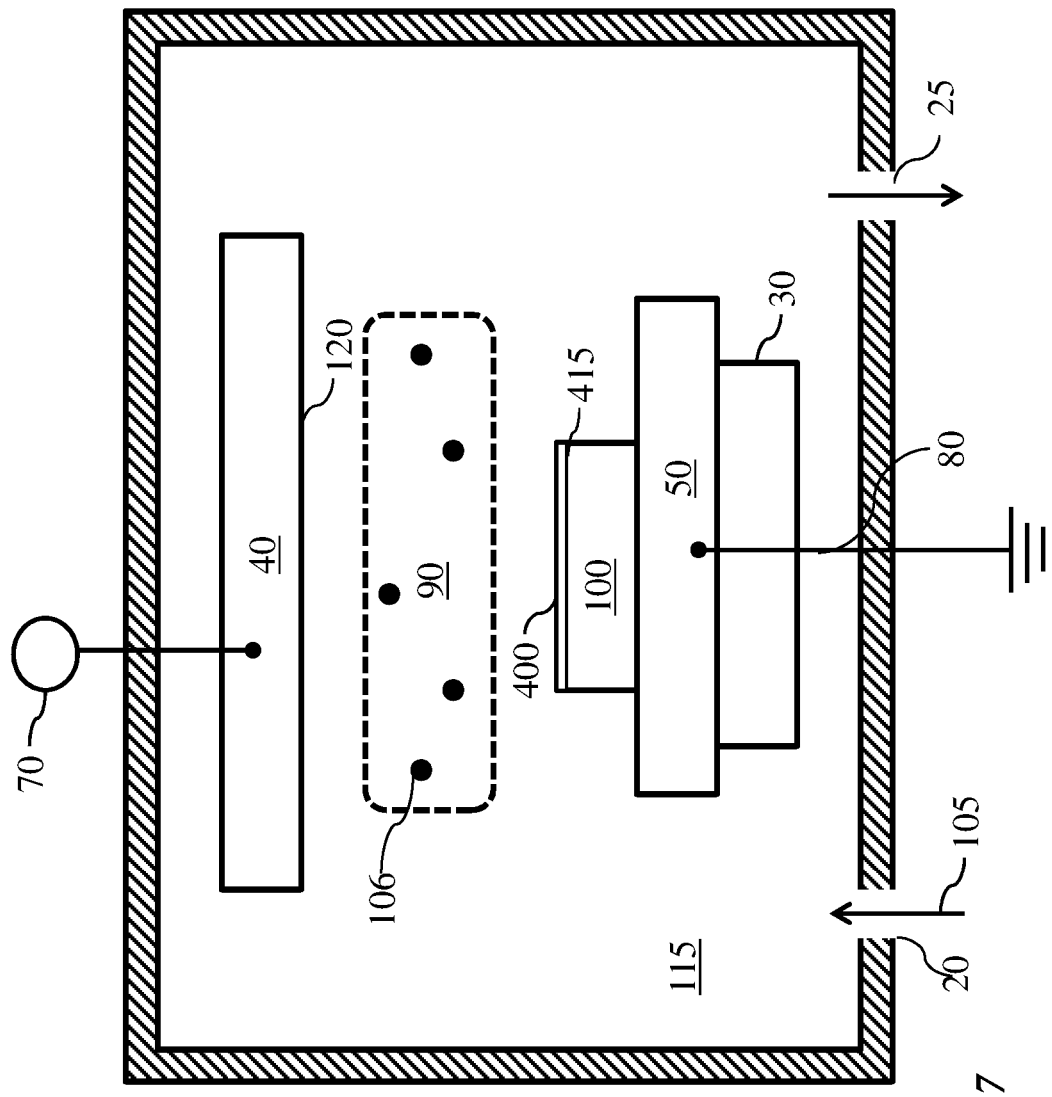
FIG. 7 illustrates a physical vapor deposition system used to form the first metal layer at the back side of the substrate in accordance with embodiments of the present invention.

A physical vapor deposition tool is illustrated in FIG. 7 in accordance with embodiments of the invention. The physical vapor deposition tool will be briefly described to clearly describe the deposition of the first metal layer.

FIG. 7 illustrates a physical vapor deposition system used to form the first metal layer 400 in accordance with embodiments of the present invention. The physical vapor deposition system includes a physical vapor deposition chamber 115 that comprises a target electrode 40 (or cathode) connected to voltage source 70 (e.g., a DC voltage), an anode or bottom electrode 50 coupled to an equipotential node (ground node), on which the wafer 100 is placed. The target electrode 40 may comprise a target material 120 to be deposited. At the beginning of the deposition process, the target material 120 comprises the adhesive promoter 415. After a short time, the target material 120 is changed. Accordingly, the target material 120 is replaced after sputtering the adhesive promoter 415 onto the semiconductor wafer 100.

An inert gas 105 flows into the physical vapor deposition chamber 115 through inlet 20 and flows out through the outlet 25. The inert gas 105 forms a plasma region 90 inside the chamber forming ionized inert gas atoms 106. The bottom electrode 50 may optionally be heated by heater 30 to promote surface reactions or diffusion of deposited atoms.

The ionized inert gas atoms 106 are accelerated towards the target electrode 40, and knocks out target material atoms from the target electrode 40. The knocked out target material atoms are deposited on top of the wafer 100 to form the first metal layer 400 comprising the target material atoms.

The inert gas 105 may be a gas such as argon, neon, xeon, helium, although any other suitable gas may be used. In various embodiments, the target material 120 and the adhesion promoter 415 being deposited may comprise similar composition. For example, the adhesion promoter 415 may comprise metals such as aluminum, tantalum, titanium, platinum, cobalt, nickel, tungsten, molybdenum, and manganese. In one particular embodiment, the adhesion promoter 415 comprises aluminum when a titanium silicide layer is desired to be deposited.

However, in different embodiments, other alloys or compounds may also be deposited using the physical vapor deposition system. For example, in different embodiments the adhesion promoter 415 may comprise oxides, nitrides and/or silicides of various metals and their alloys. Examples of such metals include aluminum, tantalum, titanium, platinum, cobalt, nickel, tungsten, molybdenum, manganese and combinations thereof. Compounds may be deposited, for example, by choosing a target material 120 of desired film composition. Alternately, the target material 120 and the first metal layer 400 may comprise a different composition. In such cases, a reactive gas may be combined with the inert gas 105. The reactive gas may form the compound on the wafer 100 surface after the target material 120 is deposited on the wafer. Alternately, the reactive gas may react directly with the target electrodes 40. The deposited compound may be subsequently sputtered from the target electrodes 40. For example, in case of deposition of titanium nitride, the target material 120 comprises titanium whereas nitrogen is introduced along with the inert gas 105 and reacts to form titanium nitride either on the wafer 100 surface or on the target surface. Similarly, other films such as metal oxides (e.g. TiO2) may be deposited by reactive sputtering.

An embodiment of using the designed sputter or plasma vapor deposition system will now be discussed. For a 300 mm wafer tool, the target electrode 40 is about 16" to about 20" wide. The bottom electrode 50 may similarly be about 12" to about 20" wide. The deposition may be performed for example by flowing argon through inlet 20 at about 10 sccm to about 1000 sccm.

In one or more embodiments, the first metal layer 400 has a graded composition. In various embodiments, the composition of the first metal layer 400 at the interface between the bottom surface 203 of the substrate 200 and the first metal layer 400 comprises an increased concentration of an adhesion promoter 415. Further away from the bottom surface 203, the composition of the first metal layer 400 changes to a bulk metal composition without significant amounts of the adhesion promoter 415. Further, a metal silicide layer 405, which is a silicide of the bulk metal of the first metal layer 400 is formed at the interface between the bottom surface 203 of the substrate 200 and the first metal layer 400.

For example, in various embodiments, the hydrogen terminated silicon atoms not covered by the adhesion promoter 415 may be replaced with titanium or tungsten forming few atomic layers having the silicide. In one example embodiment, the hydrogen terminated silicon atoms not covered by the adhesion promoter 415 comprising aluminum may be replaced with titanium. In various embodiments, less than about five atomic layers of the metal silicide layer 405 are thereby formed. The metal silicide layer 405 improves the mechanical and ohmic contact in various embodiments.

In one or more embodiments, the adhesion promoter 415 is formed within a very short distance from the bottom surface 203. In various embodiments, less than about five atomic layers of the adhesion promoter 415 are deposited. In various embodiments, less than about two atomic layers of the adhesion promoter 415 are deposited. For example, the adhesion promoter may be within 1 nm to about 3 nm from the bottom surface 203. Additionally, the dose of the adhesion promoter may be so small that a continuous layer is not formed across the entire surface of the bottom surface 203. For example, the dose of the adhesion promoter may be less than 1 ppm of the surface density. As an illustration, in one embodiment, the dose of the adhesion promoter may be less than $10^{14}$ cm$^{-2}$, and in one or more embodiments between $10^{10}$ cm$^{-2}$ to $10^{14}$ cm$^{-2}$. Thus, the electrical contact may be formed between the metal silicide layer 405 and the bottom surface 203 as well.

The exact underlying physics of the adhesion promoter 415 may be different in various embodiments. For example, in various embodiments, the adhesion promoter 415 may form clusters of atoms, mesas or islands, or be distributed homogenously on the bottom surface 203 of the substrate 200. Alternatively, the adhesion promoter 415 may be a catalytic material preventing the formation of brittle intermetallic phases.

In various embodiments, all layers of the first metal layer 400 including the adhesive promoter 415 are deposited in the same physical vapor deposition chamber 115 by replacing the target material 120. Alternatively, the wafer 100 may be transferred to an adjacent tool with a different target material. In alternative embodiments, the adhesive promoter 415 may also be introduced by an implantation process, plasma doping process, molecular implantations, and others.

The adhesion may be confirmed, for example, using a scratch test. While a metal layer deposited after conventional etching results in scratching (peeling) of the metal layer, the first metal layer 400 is resistant to scratching and peeling.

A second metal layer 410 is deposited over the first metal layer 400. In various embodiments, 100 nm to about 500 nm of a second metal layer 410 are deposited. The second metal layer 410 provides a solder layer for contact formation.

A third metal layer 420 is deposited over the second metal layer 410. In various embodiments 100 nm to about 10000 nm of a third metal layer 420 are deposited. In various embodiments, the third metal layer 420 solders with the second metal layer 410 and may also protect the underlying metals from the environment. Examples of the third metal layer 420 include Au, Ag, Au alloys, Ag alloys, and combinations thereof. In some embodiments, copper may be used as the third metal layer 420. Subsequent processing may follow conventional semiconductor processing.

Embodiments of the present invention may be used along with field stop implants. Many devices such as IGBTs (insulated gate bipolar transistors), diodes and thyristors have a field stop zone. A field stop zone is formed within a substrate after thinning the substrate 200. A dopant (n-type dopant such as phosphorus or arsenic in case of IGBTs) is implanted into the bottom surface of the substrate, followed by high temperature anneal (usually greater than about 800° C.) to activate and diffuse the dopant. Multiple proton implantations may also be performed in order to produce a field stop zone. In such processes, hydrogen is implanted into a predetermined depth of the substrate, where the hydrogen atoms function as n-dopants in combination with the implant damage. In the absence of the adhesion promoter, the high temperature anneal used to form the field stop zone degrades the back side metal (i.e., the first metal layer) because the first metal layer is deposited prior to the field stop anneal. This is because the field stop anneal also forms the metal silicide layer 405 and to improve the contact resistance between the first metal layer 400 and the substrate 200. When the first metal layer 400 is deposited along with the adhesion promoter as described in various embodiments, the high temperature field stop anneal has no negative effect on the mechanical adhesion of the first metal layer.

Figure 8:
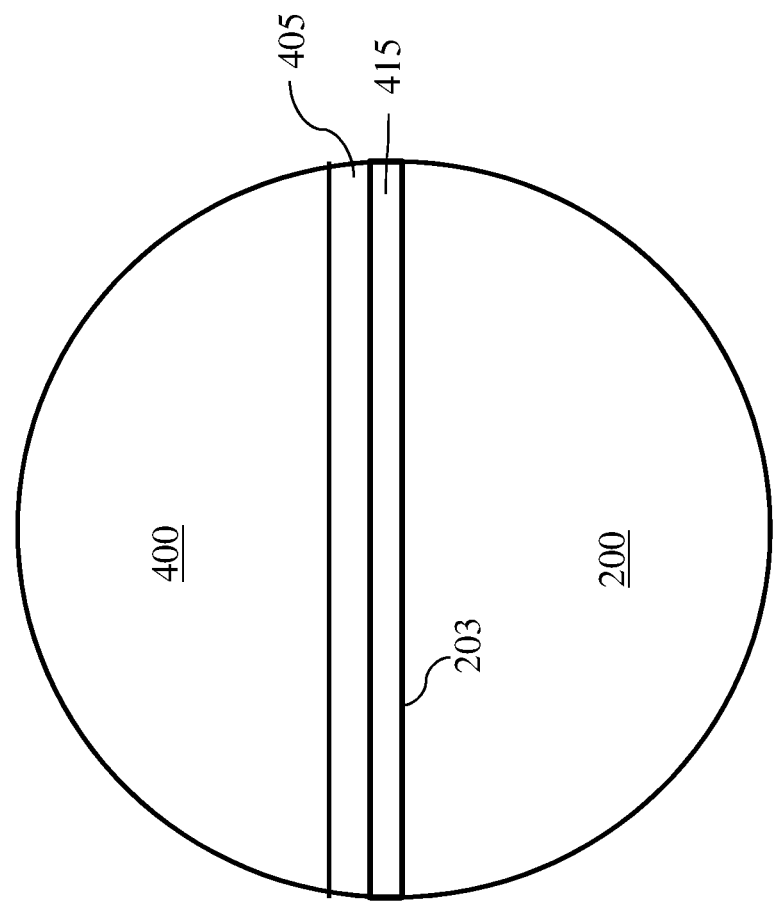
FIG. 8 illustrates a magnified cross-sectional view of a back side metallization layer illustrating a continuous adhesion promoter in accordance with an alternative embodiment of the present invention.

FIG. 8 illustrates a magnified cross-sectional view of a back side metallization layer illustrating a continuous adhesion promoter in accordance with an alternative embodiment of the present invention.

In this embodiment, the adhesion promoter 415 is formed as a very thin layer. For example, the adhesion promoter 415 is less than 5 atomic layers in one embodiment. In another embodiment, the adhesion promoter 415 is less than 3 atomic layers. In an alternative embodiment, the adhesion promoter 415 is about one to three atomic layers. As a consequence, because of the negligible thickness, the adhesion promoter 415 does not contribute to the contact resistance. In other words, the contact resistance is set by the metal silicide layer 405 and the first metal layer 400.

In this embodiment, the adhesion promoter 415 covers substantially the entire bottom surface 203 of the substrate 200. In some embodiments, the adhesion promoter 415 may prevent the transport of metal atoms and silicon atoms. If the adhesion promoter 415 blocks the diffusion of metal atoms and silicon atoms, then the metal silicide layer 405 may not be able to form.

Figures 9A, 9B:
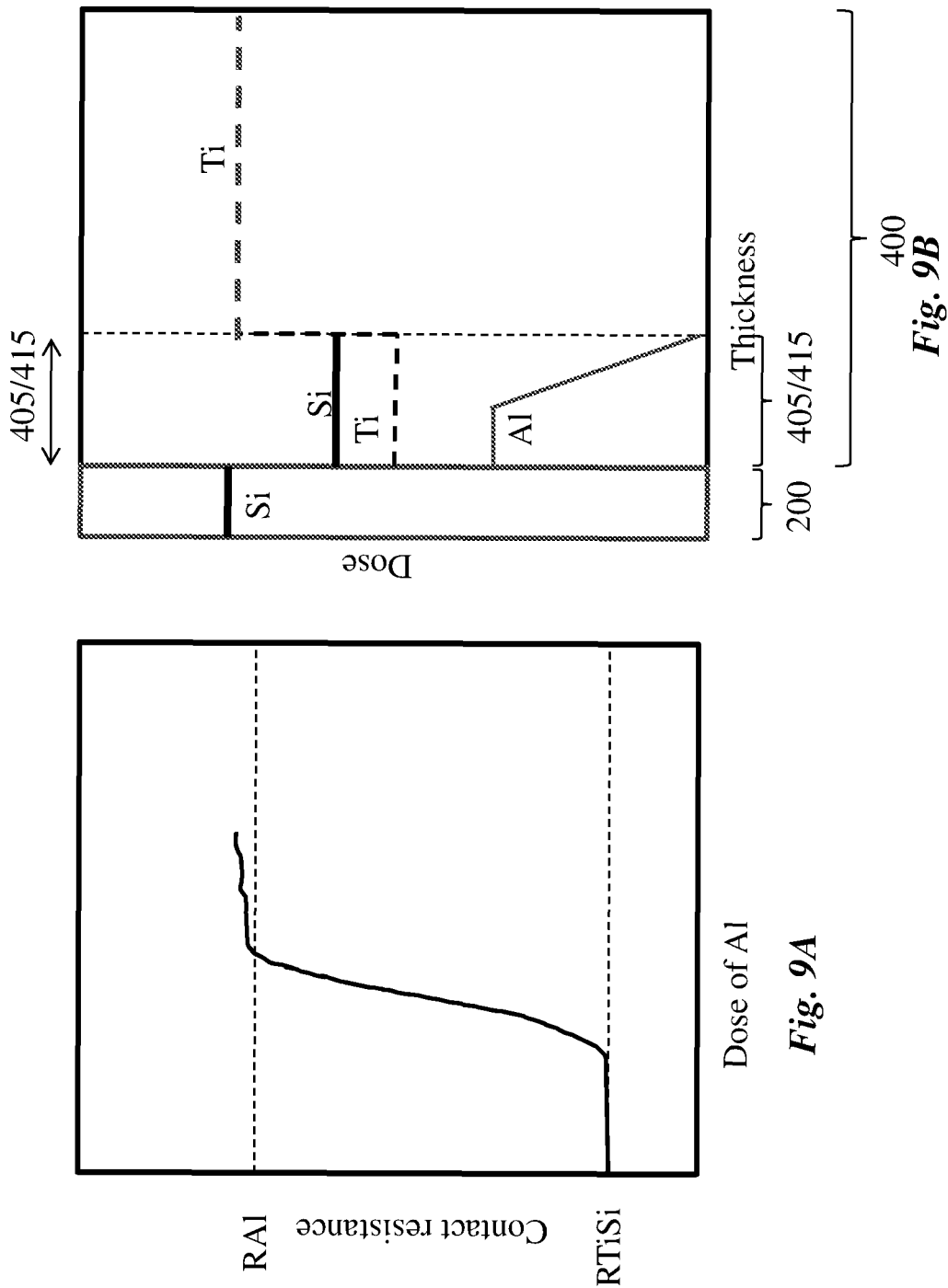
FIG. 9A illustrates a schematic of the variation of the dose of aluminum incorporated versus contact resistance between the first metal layer and the substrate.
FIG. 9B illustrates a schematic dose variation of titanium silicide, aluminum, and titanium in accordance with an embodiment of the present invention.

FIG. 9A illustrates a schematic of the variation of the dose of aluminum incorporated versus contact resistance between the first metal layer and the substrate.

Referring to FIG. 9A, at small doses of aluminum at the interface, the resistance of the contact is similar to a contact with the bulk metal of the first metal layer, which in this example is that of a titanium contact including titanium silicide. As the amount of aluminum increases, the contact resistance increases to that of aluminum and silicon indicating the formation of an aluminum layer. However, the mechanical adhesion improves even at small doses of aluminum levels significantly. Accordingly, in various embodiments, a very small amount of aluminum may be used as an adhesion promoter.

FIG. 9B illustrates a schematic concentration variation of titanium silicide, aluminum, and titanium in accordance with an embodiment of the present invention; and Only as an illustration, FIG. 9B illustrates one possible concentration/dose profile of aluminum, titanium and titanium silicide. The y-axis is not highlighting relative concentrations/doses of the different materials. In this illustration, the adhesion promoter 415 is aluminum, titanium atoms form the bulk of the first metal layer 400, and the metal silicide layer 405 is titanium silicide.

As is clear, within a short distance from the interface, the dose (concentration integrated along the bottom surface 203 of the substrate 200 in FIG. 5) of aluminum drops off. Further, the thickness of the titanium silicide may be different from the thickness of the aluminum layer. The aluminum dose may be much lower than the titanium silicide dose in various embodiments.

Figure 10:
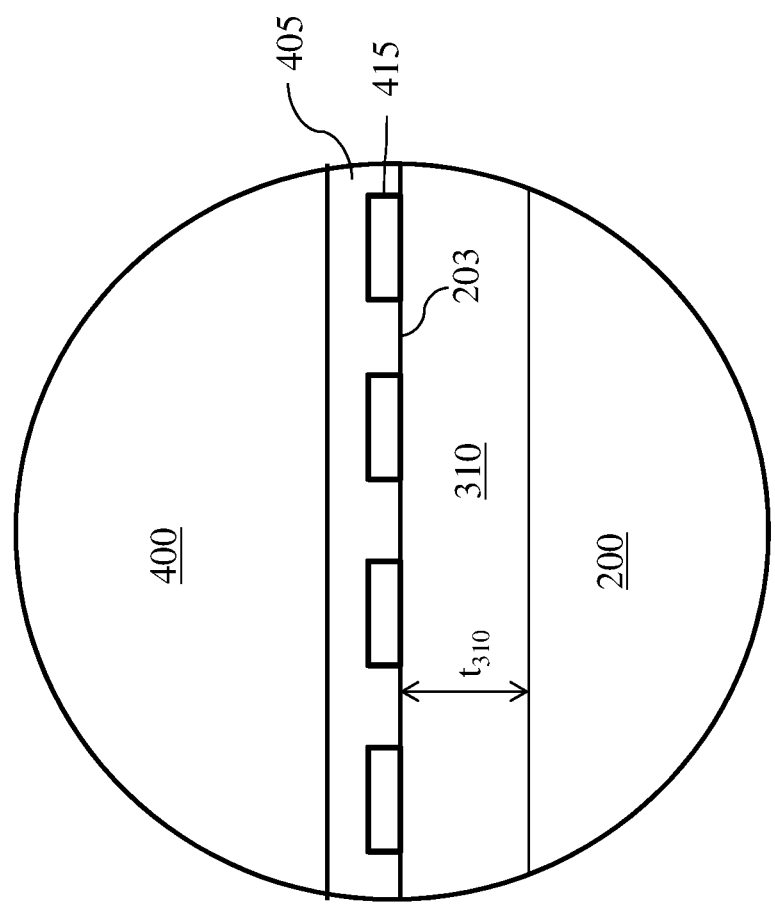
FIG. 10 illustrates an alternative embodiment of the present invention illustrating an application of the invention to contacts with shallow junctions.

FIG. 10 illustrates an alternative embodiment of the present invention illustrating an application of the invention to contacts with shallow junctions.

In various embodiments, the adhesion promoter 415 may be used to make good contacts with doped regions 310 that are shallow. If the surface roughness of the bottom surface 203 of the substrate 200 is high, the contact metal may punch through the doped region 310 due to the formation of spikes, for example. If, however, the surface roughness is lowered, for example, with the use of a hydrogen plasma clean, then the mechanical adhesion is lowered. Embodiments of the present invention enable contacts with good mechanical adhesion without compromising the electrical integrity of the contacts by the use of an adhesion promoter layer, which improves the mechanical contact without changing the electrical contact behavior.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
   metallization layers disposed over a top surface of a semiconductor substrate, the semiconductor substrate having a bottom surface opposite the top surface;
   an adhesion promoter disposed at the bottom surface of the semiconductor substrate;
   a metal silicide layer disposed over the bottom surface of the semiconductor substrate, wherein the metal silicide layer is formed around the adhesion promoter; and
   a first metal layer disposed over the metal silicide layer and the adhesion promoter, wherein a metal of the first metal layer is the same as a metal of the metal silicide layer.

2. The semiconductor device of claim 1, wherein the metal silicide layer is less than about five atomic layers in thickness.

3. The semiconductor device of claim 1, wherein a functional element is disposed proximate the top surface of the semiconductor substrate.

4. The semiconductor device of claim 1, wherein a root mean square value of surface roughness of the bottom surface is less than about 1 nm.

5. The semiconductor device of claim 1, wherein the metal silicide layer is disposed over at least 80% of the bottom surface of the semiconductor substrate.

6. The semiconductor device of claim 1, wherein the metal comprises titanium, and wherein the adhesion promoter comprises aluminum.

7. The semiconductor device of claim 1, wherein the metal comprises titanium and tungsten.

8. The semiconductor device of claim 1, further comprising a second metal layer disposed over the first metal layer, and a third metal layer disposed over the second metal layer.

9. The semiconductor device of claim 8, wherein the second metal layer comprises nickel-vanadium.

10. The semiconductor device of claim 9, wherein the third metal layer comprises silver.

11. A semiconductor device comprising:
    a semiconductor substrate having a bottom surface and an opposite top surface;
    circuitry disposed at the top surface of the semiconductor substrate;
    metallization layers disposed over the top surface of the semiconductor substrate;
    an adhesion promoter disposed at the bottom surface of the semiconductor substrate, wherein the adhesion promoter is not a continuous layer over the bottom surface;
    a metal silicide layer disposed over the bottom surface of the semiconductor substrate, wherein the metal silicide layer is formed around the adhesion promoter; and
    a first metal layer disposed over the metal silicide layer and the adhesion promoter, wherein a metal of the first metal layer is the same as a metal of the metal silicide layer.

12. The semiconductor device of claim 11, wherein the metal silicide layer is less than about five atomic layers in thickness.

13. The semiconductor device of claim 11, wherein a functional element is disposed proximate the top surface of the semiconductor substrate.

14. The semiconductor device of claim 11, wherein a root mean square value of surface roughness of the bottom surface is less than about 1 nm.

15. The semiconductor device of claim 11, wherein the metal silicide layer is disposed over at least 80% of the bottom surface of the semiconductor substrate.

16. The semiconductor device of claim 11, wherein the metal comprises titanium, and wherein the adhesion promoter comprises aluminum.

17. The semiconductor device of claim 11, wherein the metal comprises titanium and tungsten.

18. The semiconductor device of claim 11, further comprising a second metal layer disposed over the first metal layer, and a third metal layer disposed over the second metal layer.

19. The semiconductor device of claim 18, wherein the second metal layer comprises nickel-vanadium.

20. The semiconductor device of claim 1, wherein the adhesion promoter is not a continuous layer over the bottom surface.

21. A semiconductor device comprising:
    a semiconductor substrate having a bottom surface and an opposite top surface;
    circuitry disposed at the top surface of the semiconductor substrate;
    metallization layers disposed over the top surface of the semiconductor substrate;
    a doped region disposed at the bottom surface of the semiconductor substrate;
    an adhesion promoter disposed over the doped region at the bottom surface of the semiconductor substrate, wherein the adhesion promoter is not a continuous layer over the bottom surface;
    a metal silicide layer disposed over the bottom surface of the semiconductor substrate, wherein the metal silicide layer is formed around the adhesion promoter; and
    a first metal layer disposed over the metal silicide layer and the adhesion promoter, wherein a metal of the first metal layer is the same as a metal of the metal silicide layer.

* * * * *